(12) United States Patent
Jeon et al.

(10) Patent No.: US 12,198,950 B2
(45) Date of Patent: Jan. 14, 2025

(54) APPARATUS AND METHOD FOR PROCESSING SUBSTRATE

(71) Applicant: SEMES CO., LTD., Cheonan-si (KR)

(72) Inventors: Myung A Jeon, Yeosu-si (KR); Muhyeon Lee, Cheonan-si (KR); Sul Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 241 days.

(21) Appl. No.: 17/943,312

(22) Filed: Sep. 13, 2022

(65) Prior Publication Data

US 2023/0005768 A1 Jan. 5, 2023

Related U.S. Application Data

(62) Division of application No. 16/421,918, filed on May 24, 2019, now abandoned.

(30) Foreign Application Priority Data

May 25, 2018 (KR) .......................... 10-2018-0059474

(51) Int. Cl.
*H01L 21/67* (2006.01)
*B08B 3/02* (2006.01)
(Continued)

(52) U.S. Cl.
CPC ........ *H01L 21/67132* (2013.01); *B08B 3/024* (2013.01); *B08B 3/08* (2013.01);
(Continued)

(58) Field of Classification Search
CPC ................... H01L 21/67132; H01L 21/67051
See application file for complete search history.

(56) References Cited

U.S. PATENT DOCUMENTS 9,010,343 B2 * 4/2015 Miyanari .......... H01L 21/67051
134/94.1
2002/0060202 A1 5/2002 Fukunaga et al.
(Continued)

FOREIGN PATENT DOCUMENTS

CN 106098586 A 11/2016
CN 107871685 A 4/2018
(Continued)

OTHER PUBLICATIONS

Machine translation KR20150104935A (Year: 2015).*
(Continued)

*Primary Examiner* — Jacob T Minskey
*Assistant Examiner* — Wayne K. Swier
(74) *Attorney, Agent, or Firm* — Li & Cai Intellectual Property (USA) Office

(57) ABSTRACT

Embodiments of the inventive concept described herein relate to an apparatus and method for removing an adhesive exposed to the outside from an object being processed. The apparatus for removing the adhesive exposed to the outside from an edge region of the object being processed, in which the object has a patterned substrate and a support plate bonded together by the adhesive. The cover liquid nozzle dispenses the cover liquid onto a cover area of a top surface of the object other than the exposed area, and the controller controls the cover liquid dispensing member to adjust a flow rate of the cover liquid to cause a removal rate of the adhesive to remain constant.

7 Claims, 6 Drawing Sheets

(51) Int. Cl.
  *B08B 3/08* (2006.01)
  *B32B 41/00* (2006.01)
  *B32B 43/00* (2006.01)
  *H01L 21/683* (2006.01)

(52) U.S. Cl.
  CPC ............ *B32B 41/00* (2013.01); *B32B 43/006* (2013.01); *H01L 21/67051* (2013.01); *H01L 21/6708* (2013.01); *H01L 21/6836* (2013.01); *B32B 2457/14* (2013.01); *H01L 2221/68381* (2013.01); *Y10S 134/902* (2013.01)

(56) References Cited

U.S. PATENT DOCUMENTS

| | | | |
|---|---|---|---|
| 2013/0248099 | A1 | 9/2013 | Shimizu et al. |
| 2016/0314994 | A1* | 10/2016 | Singh ................ H01L 21/67248 |
| 2017/0162521 | A1* | 6/2017 | Nakamura ............ H01L 21/304 |
| 2018/0090342 | A1* | 3/2018 | Hinode ............. H01L 21/31111 |

FOREIGN PATENT DOCUMENTS

| | | | | |
|---|---|---|---|---|
| EP | 1821335 | A2 * | 8/2007 | ....... H01L 21/67132 |
| JP | 2017168736 | A * | 9/2017 | ......... H01L 21/3043 |
| KR | 1020150104935 | A | 9/2015 | |
| KR | 1020160127624 | A | 11/2016 | |
| KR | 1020180034236 | A | 4/2018 | |

OTHER PUBLICATIONS

Machine translation JP2017168736A (Year: 2017).*
Korean Patent Office, Notice of Allowance issued on Aug. 8, 2022.
China Patent Office, Office action issued on May 17, 2023.
China Patent Office, Office action issued on Nov. 7, 2022.

* cited by examiner

APPARATUS AND METHOD FOR PROCESSING SUBSTRATE

CROSS-REFERENCE TO RELATED APPLICATIONS

A claim for priority under 35 U.S.C. § 119 is made to Korean Patent Application No. 10-2018-0059474 filed on May 25, 2018, in the Korean Intellectual Property Office, the entire contents of which are hereby incorporated by reference.

BACKGROUND

Embodiments of the inventive concept described herein relate to an apparatus and method for removing an adhesive exposed to the outside from an object being processed, in which the object has a substrate and a support plate bonded together by the adhesive.

A variety of processes, such as photolithography, ashing, etching, ion implantation, thin-film deposition, cleaning, and the like, are performed on a substrate to manufacture semiconductor devices.

In general, through-silicon via (TSV) substrates are very thin and easily damaged by small impacts. Due to this, as illustrated in FIG. 1, a substrate Wa is subjected to various processes in a state of being bonded to a support plate Wb. During the processes, various film layers or patterns are formed on the substrate Wa, and the substrate Wa has a predetermined thickness. After the patterns are formed on the substrate Wa, a removal process of removing an adhesive "a" exposed to the outside from the space between the substrate Wa and the support plate Wb is performed before a process of separating the substrate Wa and the support plate Wb.

The exposed adhesive "a" is removed by dispensing a removal liquid onto the area where the adhesive "a" is exposed.

However, the patterns on the substrate Wa may be damaged by the removal liquid in the process of dispensing the removal liquid onto the adhesive "a". Due to this, a method of protecting the substrate by lowering the flow rate and the temperature of the removal liquid has been proposed, but removal efficiency of the adhesive is lowered together.

Therefore, time spent performing the removal process increases, and the substrate Wa and the support plate Wb are damaged in the process in which the substrate Wa and the support plate Wb are separated from each other.

Furthermore, in the process of dispensing the removal liquid, part of the removal liquid is scattered to cause damage to the substrate and apparatuses around the substrate.

SUMMARY

Embodiments of the inventive concept provide an apparatus and method for improving efficiency in removing an exposed portion of an adhesive that bonds a substrate and a support plate together.

Embodiments of the inventive concept provide an apparatus and method for preventing damage to a substrate and a support plate in a process of removing an adhesive.

According to an exemplary embodiment, an apparatus for removing an adhesive exposed to the outside from an edge region of an object being processed, in which the object has a patterned substrate and a support plate bonded together by the adhesive, includes a support unit that supports and rotates the object, a liquid dispensing unit that dispenses a liquid onto the object, which is supported on the support unit, to remove the exposed adhesive on the object, and a controller that controls the liquid dispensing unit. The support plate has a larger diameter than the substrate, and an exposed area where the adhesive is exposed includes an area between a lateral end of the substrate and a lateral end of the support plate. The liquid dispensing unit includes a processing liquid dispensing member having a processing liquid nozzle that dispenses a processing liquid onto the exposed area and a cover liquid dispensing member having a cover liquid nozzle that dispenses a cover liquid that protects the substrate from the processing liquid. The cover liquid nozzle dispenses the cover liquid onto a cover area of a top surface of the object other than the exposed area, and the controller controls the cover liquid dispensing member to adjust a flow rate of the cover liquid to cause a removal rate of the adhesive to remain constant.

The cover liquid nozzle may dispense the cover liquid at a first flow rate or a second flow rate higher than the first flow rate, and the controller may control the cover liquid dispensing member to alternately dispense the cover liquid at the first flow rate and the second flow rate. The cover area may include a central area of the object, and the exposed area may surround the cover area.

The processing liquid dispensing member may further include an upper heater that heats the processing liquid to a process temperature higher than room temperature, and the cover liquid dispensing member may further include a cooler that cools the cover liquid to a cooling temperature lower than the process temperature.

A discharge opening of the processing liquid nozzle may be downwardly inclined toward the outside of the object from top to bottom.

The cover liquid may include a liquid that dilutes the processing liquid.

The liquid dispensing unit may further include an adjustment liquid dispensing member that dispenses an adjustment liquid onto a bottom surface of the object. The adjustment liquid dispensing member may include an adjustment liquid nozzle that dispenses the adjustment liquid onto a bottom surface of the support plate and a lower heater that heats the adjustment liquid to a heating temperature higher than the room temperature. The controller may control the lower heater to adjust the heating temperature to prevent a temperature of the support plate from being lowered to a predetermined temperature or less.

The controller may control the adjustment liquid dispensing member to cause the adjustment liquid to have a higher flow rate than the cover liquid.

According to an exemplary embodiment, a method for removing an adhesive exposed from an object being processed, in which the object has a patterned substrate and a support plate bonded together by the adhesive, includes removing the adhesive by dispensing a processing liquid onto an exposed area where the adhesive is exposed, while rotating the object, in which the support plate has a larger diameter than the substrate and the support plate and the substrate are rotated in a state of having the same center, and protecting the substrate from the processing liquid by dispensing a cover liquid onto a cover area of a top surface of the object other than the exposed area, in which a flow rate of the cover liquid is adjusted to cause a removal rate of the adhesive to remain constant.

The cover liquid may be dispensed at a first flow rate or a second flow rate higher than the first flow rate, and the cover liquid may be alternately dispensed at the first flow rate and the second flow rate. The processing liquid may have a process temperature higher than room temperature, and the cover liquid may have a cooling temperature lower than the process temperature.

The cover liquid may include a liquid that dilutes the processing liquid.

The processing liquid may include a chemical having a property of an acid or a alkali, and the cover liquid may include deionized water.

An adjustment liquid may be dispensed onto a bottom surface of the support plate to adjust a temperature of the support plate while the processing liquid and the cover liquid are being dispensed onto the top surface of the object, and the adjustment liquid may have a higher temperature than the cover liquid.

The adjustment liquid may be dispensed at a higher flow rate than the cover liquid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
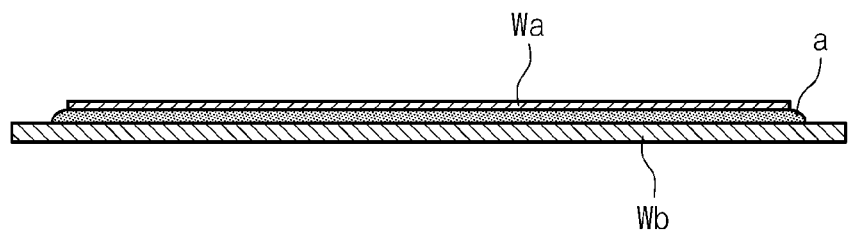
FIG. 1 is a sectional view illustrating an object that has a patterned substrate and a support plate bonded together by an adhesive.

Various modifications and variations can be made to embodiments of the inventive concept, and the scope of the inventive concept should not be constructed as limited to the embodiments set forth herein. These embodiments are provided so that this disclosure will be thorough and complete, and will fully convey the scope of the inventive concept to those skilled in the art. Therefore, in the drawings, the shapes of components are exaggerated for clarity of illustration.

A process of cleaning or etching an object will be exemplified in this embodiment. Here, the object is defined as an object that has a substrate and a support plate bonded together by an adhesive. Hereinafter, embodiments of the inventive concept will be described in detail with reference to FIGS. 2 to 7.

Figure 2:
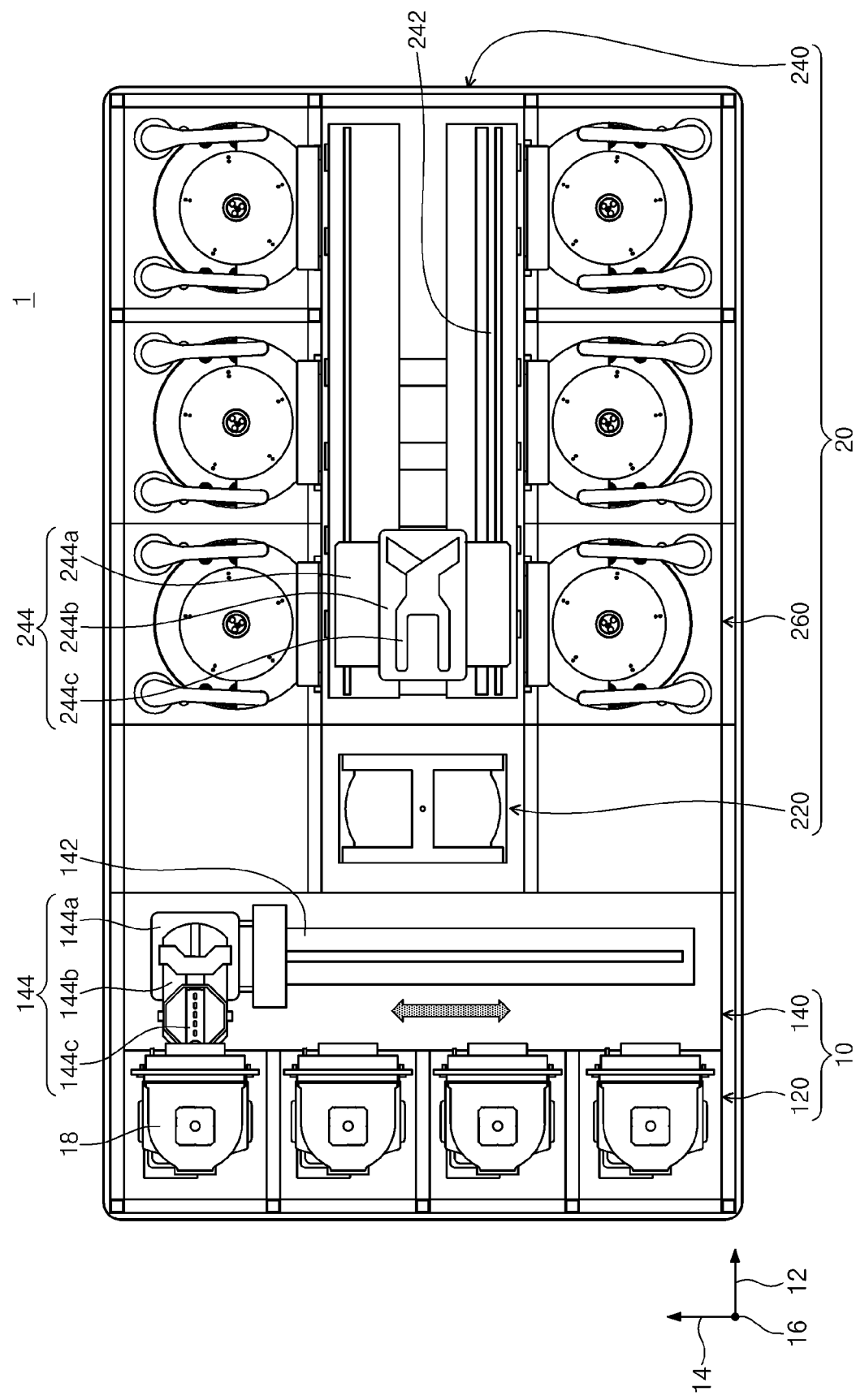
FIG. 2 is a plan view illustrating substrate processing equipment according to an embodiment of the inventive concept.

FIG. 2 is a plan view illustrating substrate processing equipment 1 according to an embodiment of the inventive concept. Referring to FIG. 2, the substrate processing equipment 1 includes an index module 10 and a processing module 20. The index module 10 includes load ports 120 and a transfer frame 140. The load ports 120, the transfer frame 140, and the processing module 20 are sequentially arranged in a row. Hereinafter, the direction in which the load ports 120, the transfer frame 140, and the processing module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

Carriers 18 in each of which objects to be processed are received are placed on the load ports 120. The plurality of load ports 120 are arranged in a row along the second direction 14. The number of load ports 120 may be increased or decreased depending on conditions such as process efficiency and footprint of the processing module 20. Each of the carriers 18 includes a plurality of slots (not illustrated) for receiving the objects in a horizontal position relative to the ground. A front opening unified pod (FOUP) may be used as the carrier 18.

The processing module 20 includes a buffer unit 220, a transfer chamber 240, and process chambers 260. The transfer chamber 240 is arranged such that the longitudinal direction thereof is parallel to the first direction 12. The process chambers 260 are arranged on opposite sides of the transfer chamber 240. The process chambers 260 on the opposite sides of the transfer chamber 240 are located in symmetric positions with respect to the transfer chamber 240. Some of the process chambers 260 are arranged along the longitudinal direction of the transfer chamber 240. Furthermore, other process chambers 260 are stacked one above another. That is, the process chambers 260 may be arranged in an A×B array on the one side of the transfer chamber 240. Here, A denotes the number of process chambers 260 arranged in a row along the first direction 12, and B denotes the number of process chambers 260 arranged in a column along the third direction 16. In the case where four or six process chambers 260 are disposed on the one side of the transfer chamber 240, the process chambers 260 may be arranged in a 2×2 or 3×2 array. The number of process chambers 260 may be increased or decreased.

Alternatively, the process chambers 260 may be disposed on only the one side of the transfer chamber 240. In another case, the process chambers 260 may be disposed in a single layer on the opposite sides of the transfer chamber 240.

The buffer unit 220 is disposed between the transfer frame 140 and the transfer chamber 240. The buffer unit 220 provides a space in which the objects stay before transferred between the transfer chamber 240 and the transfer frame 140. The buffer unit 220 includes slots (not illustrated) in which the objects are placed. The slots (not illustrated) are spaced apart from each other along the third direction 16. The buffer unit 220 is open at one side facing the transfer frame 140 and at an opposite side facing the transfer chamber 240.

The transfer frame 140 transfers the objects between the carriers 18 placed on the load ports 120 and the buffer unit 220. An index rail 142 and an index robot 144 are provided in the transfer frame 140. The index rail 142 is arranged such that the longitudinal direction thereof is parallel to the second direction 14. The index robot 144 is mounted on the index rail 142 and linearly moves along the index rail 142 in the second direction 14. The index robot 144 includes a base 144a, a body 144b, and a plurality of index arms 144c. The base 144a is movable along the index rail 142. The body 144b is coupled to the base 144a. The body 144b is movable on the base 144a along the third direction 16. Furthermore, the body 144b is rotatable on the base 144a. The index arms 144c are coupled to the body 144b and are movable forward and backward relative to the body 144b. The plurality of index arms 144c may operate individually. The index arms 144c are stacked one above another with a spacing gap therebetween along the third direction 16. Some of the index arms 144c may be used to transfer processed objects from the processing module 20 to the carriers 18, and the other index arms 144c may be used to transfer objects to be processed, from the carriers 18 to the processing module 20. Accordingly, particles generated from the objects to be processed may be prevented from adhering to the processed objects in the process in which the index robot 144 transfers the objects between the carriers 18 and the processing module 20.

The transfer chamber 240 transfers the objects between the buffer unit 220 and the process chambers 260 and between the process chambers 260. A guide rail 242 and a main robot 244 are provided in the transfer chamber 240. The guide rail 242 is arranged such that the longitudinal direction thereof is parallel to the first direction 12. The main robot 244 is mounted on the guide rail 242 and linearly moves on the guide rail 242 along the first direction 12. The main robot 244 includes a base 244a, a body 244b, and a plurality of main arms 244c. The base 244a is movable along the guide rail 242. The body 244b is coupled to the base 244a. The body 244b is movable on the base 244a along the third direction 16. Furthermore, the body 244b is rotatable on the base 244a. The plurality of main arms 244c are coupled to the body 244b and are movable forward and backward relative to the body 244b. The plurality of main arms 244c may operate individually. The main arms 244c are stacked one above another with a spacing gap therebetween along the third direction 16.

Substrate processing apparatuses 300 for performing cleaning processes on the objects are provided in the process chambers 260, respectively. The substrate processing apparatuses 300 may have different structures according to the types of cleaning processes. Alternatively, the substrate processing apparatuses 300 in the respective process chambers 260 may have the same structure. Furthermore, the process chambers 260 may be divided into a plurality of groups. The substrate processing apparatuses 300 in the process chambers 260 belonging to the same group may be the same as each other, and the substrate processing apparatuses 300 in the process chambers 260 belonging to different groups may have different structures.

Each of the substrate processing apparatuses 300 performs liquid processing on an object. Here, the object has a patterned substrate and a support plate bonded together by an adhesive. The substrate processing apparatus 300 removes the adhesive exposed from the object. According to an embodiment, the support plate may have a larger diameter than the substrate, and the substrate may be stacked on the support plate to have the same center as the support plate. An exposed area of the adhesive may be an area between a lateral end of the substrate and a lateral end of the support plate.

Figure 3:
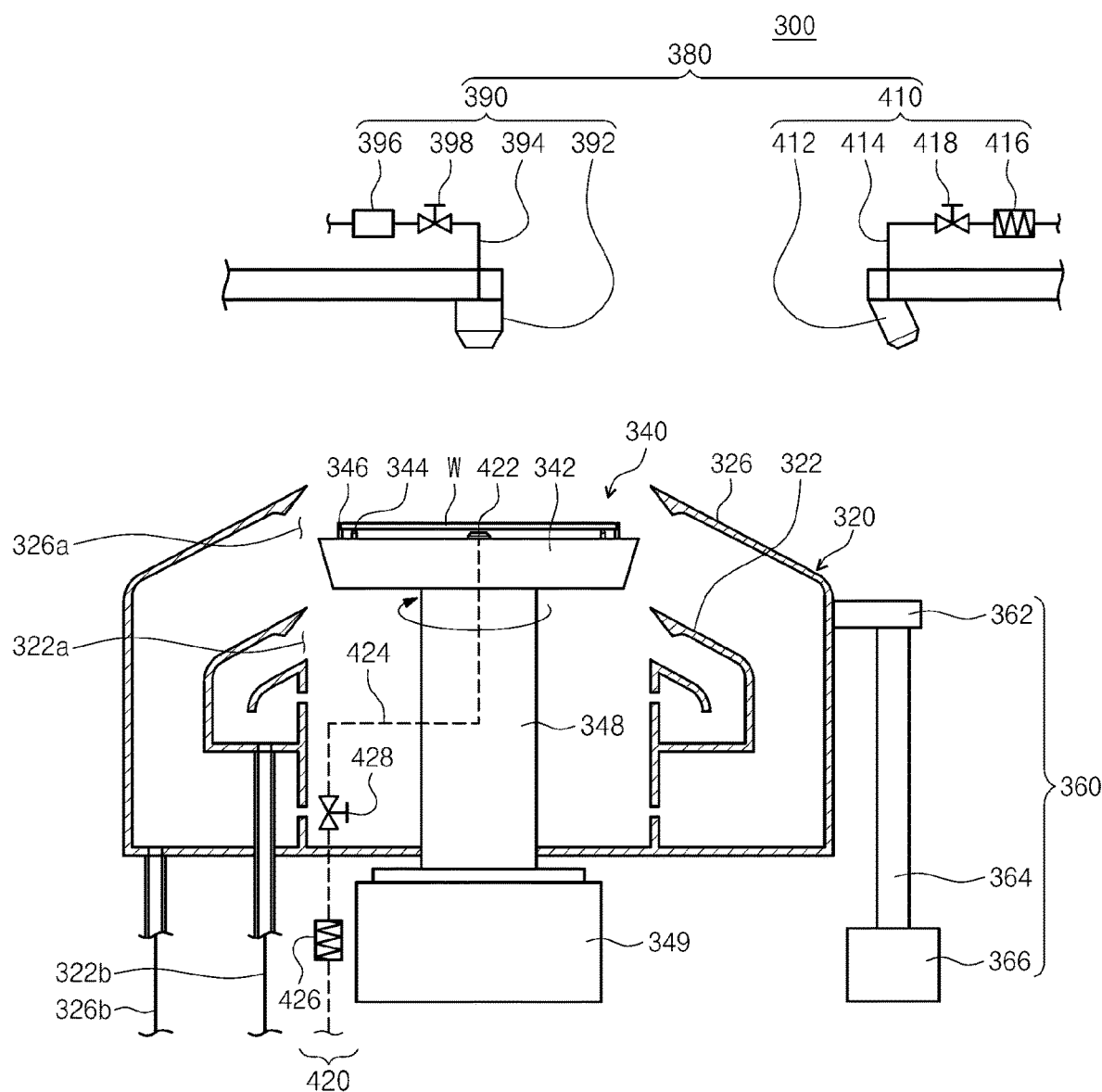
FIG. 3 is a sectional view illustrating a substrate processing apparatus of FIG. 2.

The substrate processing apparatus 300 performs a process of removing an exposed portion of the adhesive between the substrate and the support plate. FIG. 3 is a sectional view illustrating the substrate processing apparatus 300 of FIG. 2. Referring to FIG. 3, the substrate processing apparatus 300 includes a processing vessel 320, a support unit 340, a lifting unit 360, a liquid dispensing unit 380, and a controller 500.

The processing vessel 320 has a bowl shape that is open at the top. The processing vessel 320 includes an inner recovery bowl 322 and an outer recovery bowl 326. The recovery bowls 322 and 326 recover different processing fluids used in processes. The inner recovery bowl 322 has an annular ring shape that surrounds the support unit 340, and the outer recovery bowl 326 has an annular ring shape that surrounds the inner recovery bowl 322. An inner space 322a of the inner recovery bowl 322 functions as a first inlet 322a through which a processing liquid is introduced into the inner recovery bowl 322. A space 326a between the inner recovery bowl 322 and the outer recovery bowl 326 functions as a second inlet 326a through which a processing liquid is introduced into the outer recovery bowl 326. According to an embodiment, the inlets 322a and 326a may be located at different heights. Recovery lines 322b and 326b are connected to the bottoms of the recovery bowls 322 and 326, respectively. The processing liquids introduced into the recovery bowls 322 and 326 may be delivered to an external processing liquid regeneration system (not illustrated) through the recovery lines 322b and 326b and may be regenerated by the regeneration system.

During processing, the support unit 340 supports and rotates the object being processed. The support unit 340 includes a spin head 342, support pins 344, chuck pins 346, and a support shaft 348. The spin head 342 has a top surface with a substantially circular shape when viewed from above. The top surface of the spin head 342 has a larger diameter than the object. The support shaft 348 that is rotatable by an actuator 349 is fixedly coupled to a bottom surface of the spin head 342. A adjustment liquid nozzle 422 is installed in the center of the top surface of the spin head 342. The adjustment liquid nozzle 422 dispenses an adjustment liquid onto a bottom surface of the object. The adjustment liquid prevents a processing liquid from flowing down to the bottom surface of the object. For example, a low heater 426 may be installed on an adjustment liquid supply line 424 for supplying the adjustment liquid into the adjustment liquid nozzle 422. The adjustment liquid heated by the low heater 426 may clean the bottom surface of the object and may simultaneously heat the object to improve efficiency in removing the adhesive.

The plurality of support pins 344 are arranged on an edge portion of the top surface of the spin head 342 with a predetermined spacing gap therebetween and protrude upward from the spin head 342. The support pins 344 are arranged to form an annular ring shape as a whole by a combination thereof. The support pins 344 support the edge of the bottom surface of the object to cause the object to be spaced apart from the top surface of the spin head 342 by a predetermined distance.

The plurality of chuck pins 346 are disposed farther away from the center of the spin head 342 than the support pins 344. The chuck pins 346 protrude upward from the spin head 342. The chuck pins 346 support the side of the object to prevent the object from deviating from the correct position to a side when the spin head 342 rotates. The chuck pins 346 are linearly movable between a standby position and a support position along the radial direction of the spin head 342. The standby position is a position farther away from the center of the spin head 342 than the support position. The chuck pins 346 are located in the standby position when the object is loaded on, or unloaded from, the spin head 342 and are located in the support position when a process is performed on the object. In the support position, the chuck pins 346 are brought into contact with the side of the object. According to an embodiment, upper ends of the chuck pins 346 may be located at the same height as, or in a lower position than, an upper end of the support plate. When viewed from above, the chuck pins 346 and the object may not overlap each other in the state in which the chuck pins 346 support the object. Due to this, in the process in which a liquid dispensed onto the object flows down outside the object, scattering of the liquid from the chuck pins 346 may be minimized.

The lifting unit 360 linearly moves the processing vessel 320 in the vertical direction. The height of the processing vessel 320 relative to the spin head 342 is varied as the processing vessel 320 is vertically moved. The lifting unit 360 includes a bracket 362, a movable shaft 364, and an actuator 366. The bracket 362 is fixedly attached to an outer wall of the processing vessel 320. The movable shaft 364 is fixedly coupled to the bracket 362 and vertically moved by the actuator 366. When the object is placed on the spin head 342 or lifted up from the spin head 342, the processing vessel 320 is lowered to cause the spin head 342 to protrude above the processing vessel 320. Furthermore, when a process is performed, the height of the processing vessel 320 is adjusted depending on the type of processing liquid dispensed onto the object, such that the processing liquid is introduced into a preset recovery bowl. Alternatively, the lifting unit 360 may vertically move the spin head 342.

The liquid dispensing unit 380 dispenses various types of liquids onto the object W being processed. The liquid dispensing unit 380 includes a cover liquid dispensing member 390, a processing liquid dispensing member 410, and an adjustment liquid dispensing member 420.

The cover liquid dispensing member 390 dispenses a cover liquid onto a top surface of the object W. The cover liquid is provided as a protection liquid for protecting the substrate Wa from a processing liquid. The cover liquid dispensing member 390 includes a cover liquid nozzle 392, a cover liquid supply line 394, and a cooler 396. The cover liquid nozzle 392 is located above the object W. The cover liquid nozzle 392 dispenses the cover liquid onto a cover area Z1 of the object W. Here, the cover area Z1 includes a central area of the object W. For example, the cover liquid nozzle 392 may dispense the cover liquid onto the center of a top surface of the substrate Wa. The cover liquid supply line 394 supplies the cover liquid into the cover liquid nozzle 392. A cover valve 398 is installed on the cover liquid supply line 394, and the flow rate of the cover liquid is adjusted by the cover valve 398. For example, the cover liquid may be dispensed at a first flow rate L1, or at a second flow rate L2 higher than the first flow rate L1, by the cover valve 398. The cooler 396 is installed on the cover liquid supply line 394. The cooler 396 cools the cover liquid to a cooling temperature of T1. Here, the cooling temperature T1 is lower than the temperature of the processing liquid. The cooling temperature T1 may be equal to or lower than the room temperature. For example, the cover liquid may be a liquid for diluting the processing liquid. The cover liquid may be deionized water (DIW).

Alternatively, the cover liquid nozzle 392 may be moved to dispense the cover liquid between the center of the top surface of the substrate Wa and an edge region of the top surface thereof.

The processing liquid dispensing member 410 dispenses the processing liquid onto the top surface of the object W. The processing liquid is provided as a removal liquid for removing the adhesive. The processing liquid dispensing member 410 includes a processing liquid nozzle 412, a processing liquid supply line 414, and an upper heater 416. The processing liquid nozzle 412 is located above the object W. The processing liquid nozzle 412 dispenses the processing liquid onto an exposed area Z2 of the object W. Here, the exposed area Z2 includes the area where the removal liquid is exposed when the object W is viewed from above. The exposed area Z2 may be the area between the lateral end of the substrate Wa and the lateral end of the support plate Wb when viewed from above. The exposed area Z2 may be the area that surrounds the cover area Z1 when viewed from above. The processing liquid nozzle 412 may have a discharge opening that is downwardly inclined toward the outside of the object W from top to bottom. The direction in which the processing liquid is dispensed may agree with the radial direction of the object W when viewed from above. Accordingly, the processing liquid may be prevented from being scattered from the object W and bounced toward the cover area Z1 again. The processing liquid supply line 414 supplies the processing liquid into the processing liquid nozzle 412. The upper heater 416 is installed on the processing liquid supply line 414. The upper heater 416 heats the processing liquid to a process temperature. Here, the process temperature may be higher than the cooling temperature T1. The process temperature may be higher than the room temperature. The process temperature is proportional to the removal rate of the adhesive "a". Due to this, the removal rate of the adhesive "a" may increase as the process temperature rises. For example, the processing liquid may be a strong acidic or alkali chemical.

The adjustment liquid dispensing member 420 dispenses an adjustment liquid onto the bottom surface of the object W. The adjustment liquid is provided as a liquid for adjusting the temperature of the support plate Wb. The adjustment liquid is provided as a liquid for preventing the temperature of the support plate Wb from being lowered to a predetermined temperature or less. The adjustment liquid dispensing member 420 includes the adjustment liquid nozzle 422, the adjustment liquid supply line 424, and the lower heater 426. The adjustment liquid nozzle 422 is located below the object W. The adjustment liquid nozzle 422 may be installed on the spin head 342. The adjustment liquid nozzle 422 may be located such that the discharge opening thereof is aligned with the central axis of the spin head 342. The adjustment liquid nozzle 422 dispenses the adjustment liquid onto a bottom surface of the support plate Wb. According to an embodiment, the adjustment liquid may be dispensed onto a central area of the bottom surface of the support plate Wb. Accordingly, the adjustment liquid dispensed onto the support plate Wb may be uniformly spread over the support plate Wb by a centrifugal force and may uniformly adjust the temperature of the support plate Wb by regions.

The adjustment liquid supply line 424 supplies the adjustment liquid into the adjustment liquid nozzle 422. A control valve 428 is installed on the adjustment liquid supply line 424. The control valve 428 opens or closes the adjustment liquid supply line 424 to adjust the flow rate of the adjustment liquid supplied. For example, the flow rate of the adjustment liquid supplied may be higher than the second flow rate L2 of the cover liquid. The lower heater 426 is installed on the adjustment liquid supply line 424. The lower heater 426 heats the adjustment liquid to a heating temperature T2 higher than the room temperature. For example, the heating temperature T2 may be equal to the process temperature.

Accordingly, the substrate Wa and the support plate Wb may have different temperatures. The substrate Wa may be cooled by the cover liquid and may be prevented from being damaged by the temperature of the processing liquid.

Furthermore, a liquid film by the cover liquid is formed on the substrate Wa to prevent the processing liquid from damaging patterns formed on the substrate Wa.

Moreover, the adjustment liquid prevents the temperatures of the support plate Wb and the processing liquid from being lowered by the cover liquid. Accordingly, the removal rate of the adhesive "a" may be prevented from being lowered.

In addition, the flow rate of the adjustment liquid is higher than the flow rate of the cover liquid. Accordingly, the temperatures of the support plate Wb, the adhesive "a", and the processing liquid may be prevented from being lowered to a predetermine temperature or less by the cover liquid.

The controller 500 adjusts the flow rate of the cover liquid to cause the removal rate of the adhesive "a" to remain constant. The controller 500 may control the cover valve 398 to alternately dispense the cover liquid at the first flow rate L1 and the second flow rate L2. The cover liquid dilutes the processing liquid, and the removal rate of the adhesive "a" is lowered as the amount of processing liquid diluted increases. Accordingly, the cover liquid may be alternately dispensed at the first flow rate L1 and the second flow rate L2 to adjust the concentration of the processing liquid to a constant level. Furthermore, the controller 500 may control the cooler 396, the lower heater 426, and the upper heater 416 to cause the cover liquid, the adjustment liquid, and the processing liquid to have the cooling temperature T1, the heating temperature T2, and the process temperature, respectively, as described above.

Next, a process of removing the exposed adhesive "a" in the exposed area Z2 of the object W by using the above-described substrate processing apparatus 300 will be described. Prior to description of the process of removing the adhesive "a", it should be noted that the object W being processed includes the patterned substrate Wa and the support plate Wb. The substrate Wa may a substrate Wa for through-silicon via (TSV). The substrate Wa may be thinner than the support plate Wb.

Figure 4:
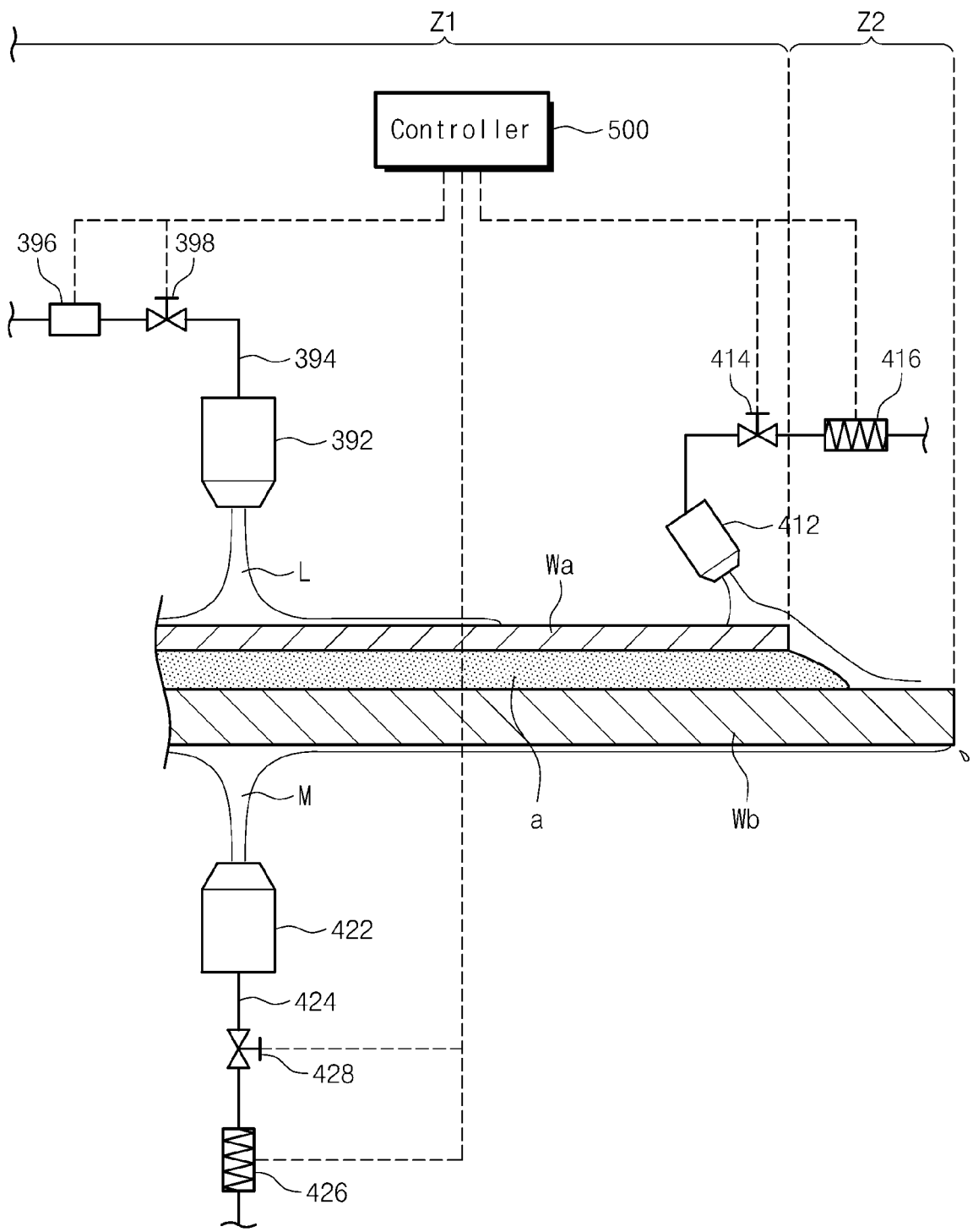
FIG. 4 is a sectional view illustrating a process of dispensing a processing liquid onto an object by using the apparatus of FIG. 3.
Figure 5:
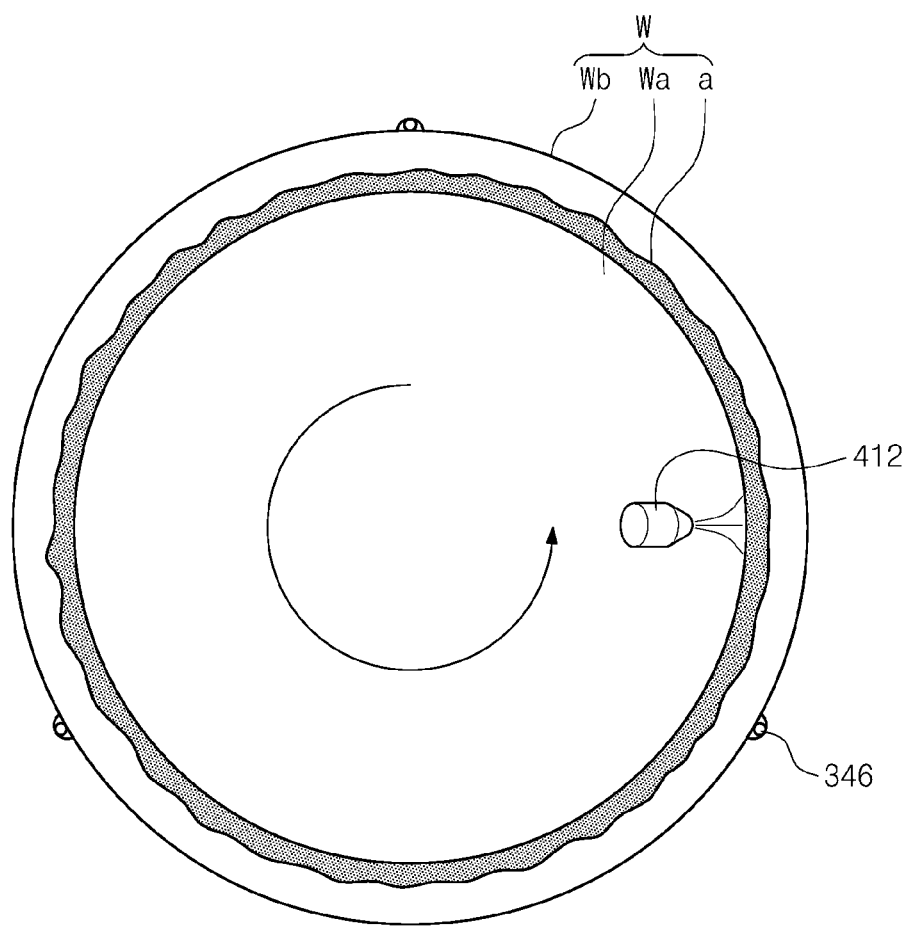
FIG. 5 is a plan view illustrating the object and a processing liquid nozzle of FIG. 4.
Figure 6:
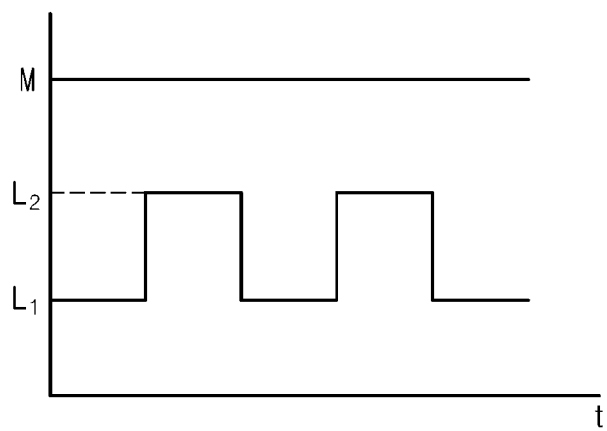
FIG. 6 is a graph depicting flow rates of a cover liquid and an adjustment liquid over time in FIG. 5.
Figure 7:
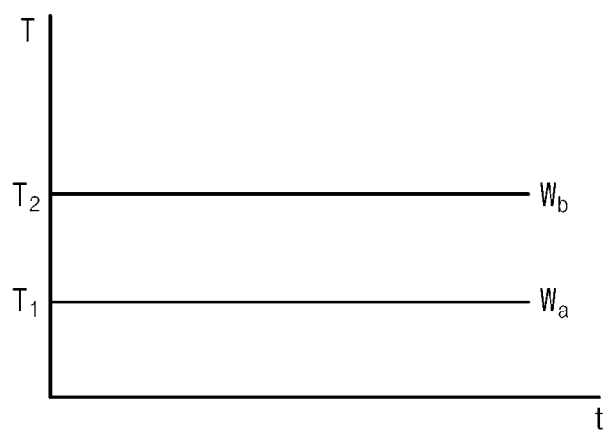
FIG. 7 is a graph depicting temperatures of a substrate and a support plate over time in FIG. 5.

FIG. 4 is a sectional view illustrating a process of dispensing the processing liquid onto the object W by using the apparatus of FIG. 3, and FIG. 5 is a plan view illustrating the object W and the processing liquid nozzle 412 of FIG. 4. When the object W is placed on the support pins 344, the chuck pins 346 move from the standby position to the support position and support the side of the support plate Wb. The object W is rotated, and the cover liquid nozzle 392 dispenses the cover liquid L onto the cover area Z1 of the object W before the processing liquid is dispensed. The cover liquid L forms a liquid film on the entire top surface of the object W by a centrifugal force. Thereafter, the processing liquid nozzle 412 dispenses the processing liquid onto the exposed area Z2. Accordingly, a film of cover liquid L is formed on the cover area Z1, and a film of processing liquid is formed on the exposed area Z2. Referring to FIGS. 6 and 7, the cover liquid is alternately dispensed at the first flow rate L1 and the second flow rate L2 to dilute the processing liquid, thereby adjusting the removal rate of the adhesive "a" to a constant level. The adjustment liquid M is dispensed before or at the same time as the cover liquid M to prevent the temperature of the support plate Wb from being lowered. The adjustment liquid M is dispensed at a higher flow rate than the second flow rate L2 of the cover liquid L and therefore prevents the temperature of the support plate Wb from being lowered to the cooling temperature T1.

Furthermore, the processing liquid is dispensed in a downwardly inclined direction away from the center of the object W, and the upper ends of the chuck pins 346 are located at the same height as, or in a lower position than, the upper end of the support plate Wb. Accordingly, scattering of the processing liquid may be minimized.

According to the embodiments of the inventive concept, the flow rate of the cover liquid is adjusted to allow the removal rate of the adhesive to remain constant.

Furthermore, the cover liquid is dispensed onto the substrate and has a lower temperature than the processing liquid. Thus, the substrate may be prevented from being damaged by the temperature of the processing liquid.

Moreover, the adjustment liquid is dispensed onto the support plate and has a higher temperature than the cover liquid. Thus, the temperature of the processing liquid may be prevented from being lowered by the cover liquid.

In addition, the processing liquid is dispensed in a downwardly inclined direction toward the outside of the object being processed. Thus, the processing liquid may be prevented from being scattered and dropped over the substrate.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for removing an adhesive exposed from an object being processed, wherein the object has a patterned substrate and a support plate bonded together by the adhesive, the method comprising:
    removing the adhesive by dispensing a processing liquid onto an exposed area where the adhesive is exposed, while rotating the object, wherein the support plate has a larger diameter than the substrate, and the support plate and the substrate are rotated in a state of having the same center; and
    protecting the substrate from the processing liquid by dispensing a cover liquid onto a cover area of a top surface of the object other than the exposed area,
    wherein the processing liquid is dispensed by a processing liquid nozzle having a discharge opening downwardly inclined toward an outside of the object from top to bottom,
    wherein the cover liquid forms a cover liquid film, and then the processing liquid is dispensed by the processing liquid nozzle, and
    wherein a flow rate of the cover liquid is adjusted to cause a removal rate of the adhesive to remain constant.

2. The method of claim 1, wherein the cover liquid is dispensed at a first flow rate or a second flow rate higher than the first flow rate, and
    wherein the cover liquid is alternately dispensed at the first flow rate and the second flow rate.

3. The method of claim 2, wherein the processing liquid has a process temperature higher than room temperature, and
    wherein the cover liquid has a cooling temperature lower than the process temperature.

4. The method of claim 1, wherein the cover liquid includes a liquid that dilutes the processing liquid.

5. The method of claim 4, wherein the processing liquid includes a chemical having a property of an acid or an alkali, and
    wherein the cover liquid includes deionized water.

6. The method of claim 4, wherein an adjustment liquid is dispensed onto a bottom surface of the support plate to adjust a temperature of the support plate while the processing liquid and the cover liquid are being dispensed onto the top surface of the object, and wherein the adjustment liquid has a higher temperature than the cover liquid.

7. The method of claim 6, wherein the adjustment liquid is dispensed at a higher flow rate than the cover liquid.

* * * * *